United States Patent
Ho et al.

(10) Patent No.: US 9,947,716 B2
(45) Date of Patent: Apr. 17, 2018

(54) CHIP PACKAGE AND MANUFACTURING METHOD THEREOF

(71) Applicant: XINTEC INC., Taoyuan (TW)

(72) Inventors: Yen-Shih Ho, Kaohsiung (TW); Hsiao-Lan Yeh, Tainan (TW); Chia-Sheng Lin, Taoyuan (TW); Yi-Ming Chang, Taoyuan (TW); Po-Han Lee, Taipei (TW); Hui-Hsien Wu, Taoyuan (TW); Jyun-Liang Wu, Taichung (TW); Shu-Ming Chang, New Taipei (TW); Yu-Lung Huang, Taoyuan (TW); Chien-Min Lin, Taoyuan (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 15/358,852

(22) Filed: Nov. 22, 2016

(65) Prior Publication Data

US 2017/0148844 A1    May 25, 2017

Related U.S. Application Data

(60) Provisional application No. 62/258,941, filed on Nov. 23, 2015.

(51) Int. Cl.
*H01L 27/146* (2006.01)
*H01L 21/48* (2006.01)
*H01L 21/67* (2006.01)
*H01L 23/18* (2006.01)

(52) U.S. Cl.
CPC .... *H01L 27/14698* (2013.01); *H01L 21/4803* (2013.01); *H01L 21/67017* (2013.01); *H01L 21/67132* (2013.01); *H01L 23/18* (2013.01); *H01L 27/14618* (2013.01); *H01L 27/14634* (2013.01); *H01L 27/14636* (2013.01); *H01L 27/14687* (2013.01)

(58) Field of Classification Search
None
See application file for complete search history.

(56) References Cited

U.S. PATENT DOCUMENTS

| 5,583,378 A * | 12/1996 | Marrs | H01L 24/97 257/710 |
| 2013/0164867 A1* | 6/2013 | Ramasamy | H01L 27/14618 438/25 |
| 2016/0118427 A1* | 4/2016 | Hsu | H01L 27/14636 257/434 |

FOREIGN PATENT DOCUMENTS

TW    200948052    11/2009

* cited by examiner

*Primary Examiner* — Angel Roman
*Assistant Examiner* — Kevin Quinto
(74) *Attorney, Agent, or Firm* — Liu & Liu

(57) ABSTRACT

A chip package includes a chip, an adhesive layer, and a dam element. The chip has a sensing area, a first surface, and a second surface that is opposite to the first surface. The sensing area is located on the first surface. The adhesive layer covers the first surface of the chip. The dam element is located on the adhesive layer and surrounds the sensing area. The thickness of the dam element is in a range from 20 μm to 750 μm, and the wall surface of the dam element surrounding the sensing area is a rough surface.

10 Claims, 10 Drawing Sheets

CHIP PACKAGE AND MANUFACTURING METHOD THEREOF

RELATED APPLICATIONS

This application claims priority to U.S. provisional Application Ser. No. 62/258,941, filed Nov. 23, 2015, which is herein incorporated by reference.

BACKGROUND

Field of Invention

The present invention relates to a chip package and a manufacturing method of the chip package.

Description of Related Art

When a chip package is manufactured, a glass sheet is often utilized to cover a surface of the chip for protecting the sensing area of the chip. In a typical chip package having a glass sheet, a dam element is disposed between the chip and the glass sheet, and thus the thickness of the dam element must be the same as a distance between the glass sheet and the chip. In other words, if the thickness of the dam element is greater, a gap between the glass sheet and the chip must be greater, too. A typical dam element is made of epoxy, and thus the thickness of the dam element is difficult to be reduced due to process limitations. When the sensing area receives an image, a flare issue is prone to occur.

In manufacturing a chip package, if a wafer is thin, it is difficult to move the wafer due to process limitations. In addition, since the tensile strength of the wafer may not sufficient, the wafer may easily be damaged by an external force. Moreover, a warpage issue of the thin wafer is prone to occur in manufacturing processes, and the sensing area of the wafer is easily polluted during manufacturing processes, such that product yield is difficult to improve.

SUMMARY

An aspect of the present invention is to provide a chip package.

According to an embodiment of the present invention, a chip package includes a chip, an adhesive layer, and a dam element. The chip has a sensing area, a first surface, and a second surface that is opposite to the first surface. The sensing area is located on the first surface. The adhesive layer covers the first surface of the chip. The dam element is located on the adhesive layer and surrounds the sensing area. The thickness of the dam element is in a range from 20 µm to 750 µm, and the wall surface of the dam element surrounding the sensing area is a rough surface.

An aspect of the present invention is to provide a manufacturing method of a chip package.

According to an embodiment of the present invention, a manufacturing method of a chip package includes the following steps. A carrier is ground. The carrier is patterned, such that the carrier has a recess, and the recess is defined by a bottom and a dam element of the carrier, and the dam element surrounds the bottom. An adhesive layer is used to adhere the carrier to a first surface of a wafer, and the recess is present between the adhesive layer and the bottom of the carrier. The bottom of the carrier is ground, such that a thickness of the bottom is in a range from 10 µm to 250 µm. The bottom of the carrier is simultaneously impacted and attracted, such that the bottom is separated from the dam element, and a wall surface of the dam element originally connected to the bottom forms a rough surface. The wafer and the dam element are cut to form the chip package.

In the aforementioned embodiment of the present invention, since the dam element of the chip package is formed by patterning the carrier, grinding the bottom of the carrier, and impacting the thinned bottom, the wall surface of the dam element originally connected to the bottom forms a rough surface. As a result, the wall surface of the dam element surrounding the sensing area is the rough surface. The thickness of the dam element may be effectively controlled through the chip package and the manufacturing method of the present invention, such that the dam element is prevented from being overly thick to cause a petal flare defect in an image when the sensing area detects the image. Moreover, in manufacturing the chip package, since the first surface of the wafer is adhered to the carrier through the adhesive layer, even if the wafer is thin, the thin wafer is not limited by process limitations to difficultly move, and a warpage issue is not prone to occur. In addition, in the manufacturing method of the chip package, before the bottom of the carrier is impacted, the carrier is disposed on the wafer, such that the sensing area of the chip is not easily polluted during manufacturing processes, thereby improving product yield.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Figure 1:
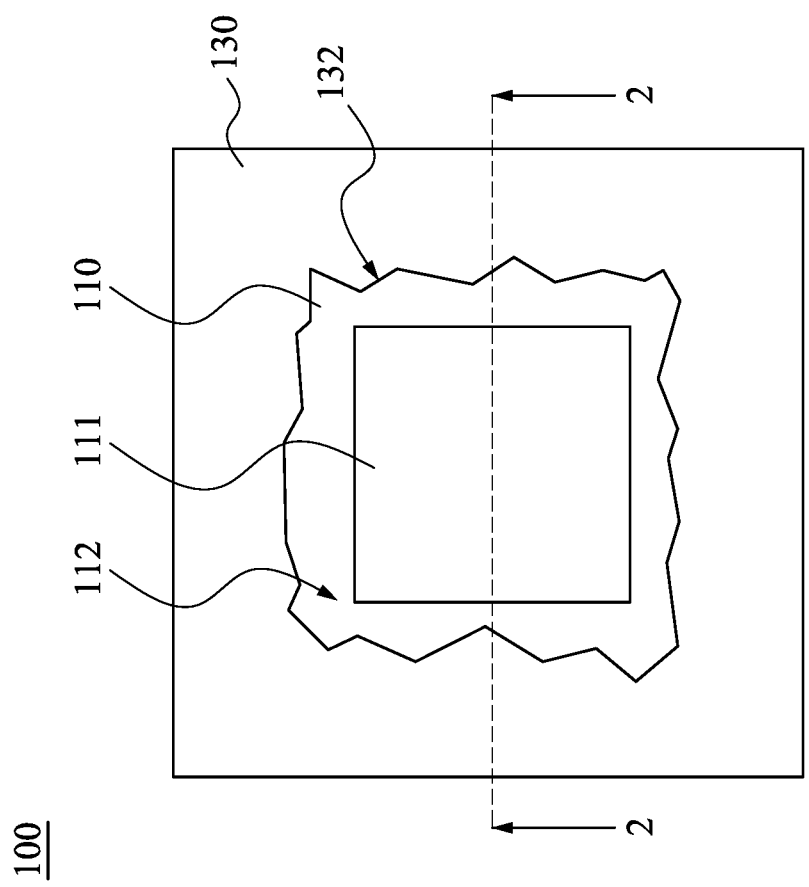
FIG. 1 is a top view of a chip package according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

Figure 2:
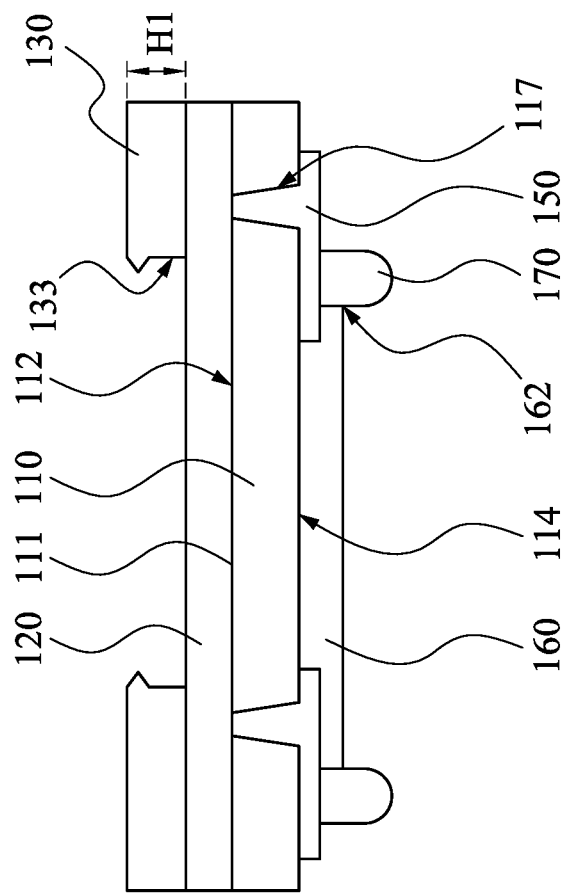
FIG. 2 is a cross-sectional view of the chip package taken along line 2-2 shown in FIG. 1.

FIG. 1 is a top view of a chip package 100 according to one embodiment of the present invention. FIG. 2 is a cross-sectional view of the chip package 100 taken along line 2-2 shown in FIG. 1. As shown in FIG. 1 and FIG. 2, the chip package 100 includes a chip 110, an adhesive layer 120, and a dam element 130. The chip 110 has a sensing area 111, a first surface 112, and a second surface 114 that is opposite to the first surface 112. The sensing area 111 is located on the first surface 112. The adhesive layer 120 covers the first surface 112 of the chip 110. The dam element 130 is located on the adhesive layer 120 and surrounds the sensing area 111. The thickness H1 of the dam element 130 is in a range from 20 μm to 750 μm, and the wall surface 133 of the dam element 130 surrounding the sensing area 111 is a rough surface.

The chip 110 is formed by cutting (dicing) a semiconductor wafer. In this embodiment, the material of the dam element 130 and the material of the chip 110 are the same, and include silicon. The dam element 130 may be formed by grinding and patterning, and by impacting another wafer (to be described hereinafter), such that the wall surface 133 of the dam element 130 is a rough surface due to the impaction, and the thickness H1 of the dam element 130 may be reduced to 20 μm. In the chip package 100 of the present invention, the thickness H1 of the dam element 130 may be effectively controlled, such that the dam element 130 is prevented from being overly thick to cause a petal flare defect in an image when the sensing area 111 detects the image.

In this embodiment, the chip 110 has a through hole 117 that is present between the first and second surfaces 112, 114. The chip package 100 further includes a redistribution layer 150, a passivation layer 160, and a conductive structure 170. The redistribution layer 150 is located in the through hole 117 of the chip 110, and extends to the second surface 114 of the chip 110. The passivation layer 160 is located on the redistribution layer 150 and the second surface 114 of the chip 110, and has an opening 162 to expose a portion of the redistribution layer 150. The conductive structure 170 is located on the redistribution layer 150 that is in the opening 162 of the passivation layer 160. The conductive structure 170 protrudes outward from the passivation layer 160 to be electrically connected to a printed circuit board.

The redistribution layer 150 may be made of a material including aluminum. The passivation layer 160 may be made of a material including epoxy, such as a solder mask. The conductive structure 170 may be a solder ball of a ball grid array (BGA) or a conductive bump, and the present invention is not limited to the shape and the material of the conductive structure 170. The dam element 130 may be made of a material including silicon, and other materials such as glass, aluminum nitride, tape, or sapphire may be also utilized to manufacture the dam element 130.

It is to be noted that the connection relationships and materials of the elements described above will not be repeated in the following description, and aspects related to a manufacturing method of the chip package 100 shown in FIG. 2 will be described.

Figure 3:
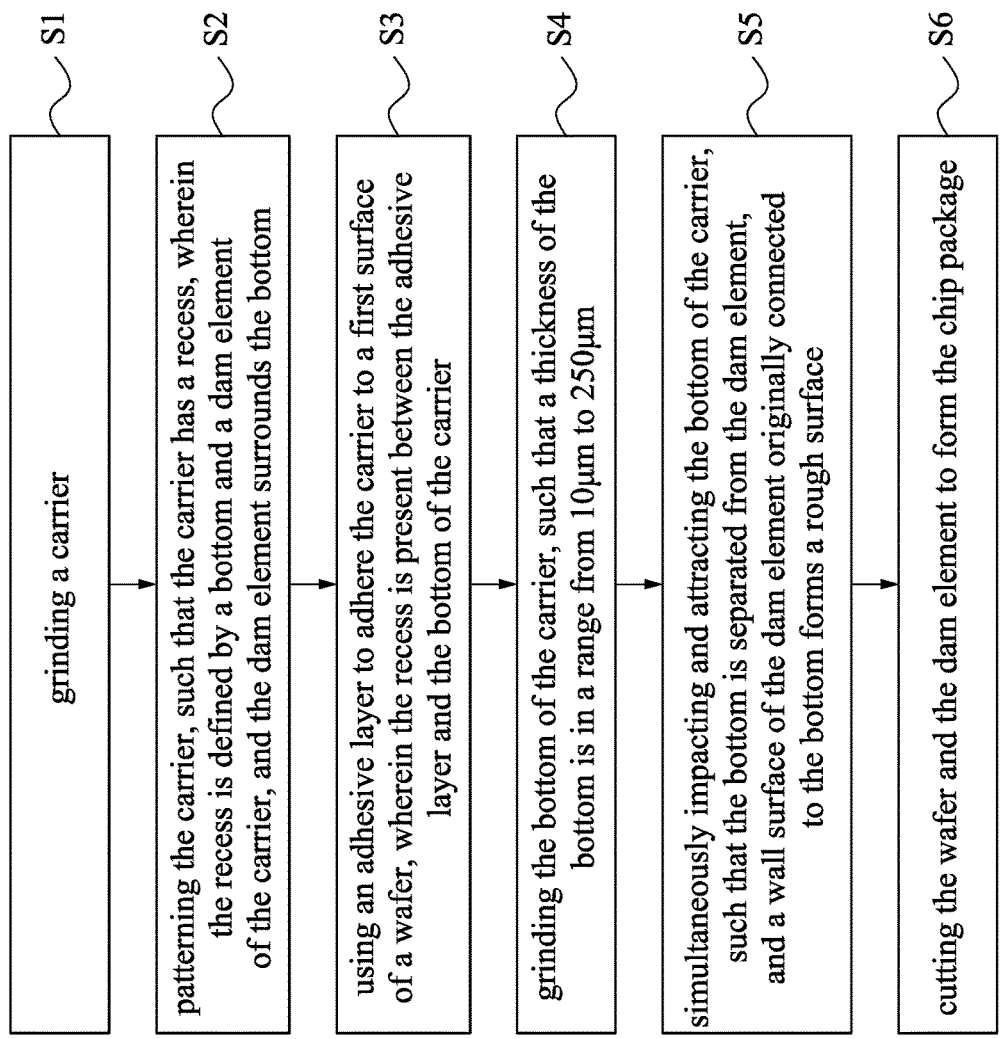
FIG. 3 is a flow chart of a manufacturing method of a chip package according to one embodiment of the present invention.

FIG. 3 is a flow chart of a manufacturing method of a chip package according to one embodiment of the present invention. The manufacturing method of the chip package includes the following steps. In step S1, a carrier is ground. Thereafter, in step S2, the carrier is patterned, such that the carrier has a recess, and the recess is defined by a bottom and a dam element of the carrier, and the dam element surrounds the bottom. Next, in step S3, an adhesive layer is used to adhere the carrier to a first surface of a wafer, and the recess is present between the adhesive layer and the bottom of the carrier. Afterwards, in step S4, the bottom of the carrier is ground, such that a thickness of the bottom is in a range from 10 μm to 250 μm. Subsequently, in step S5, the bottom of the carrier is simultaneously impacted and attracted, such that the bottom is separated from the dam element, and a wall surface of the dam element originally connected to the bottom forms a rough surface. Finally, in step S6, the wafer and the dam element are cut to form the chip package. In the following description, the aforementioned steps will be explained in detail.

Figure 4:
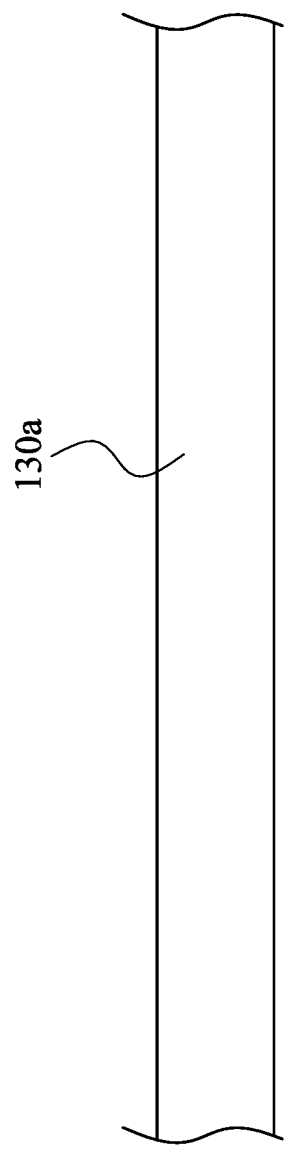
FIG. 4 is a cross-sectional view of a carrier according to one embodiment of the present invention.
Figure 5:
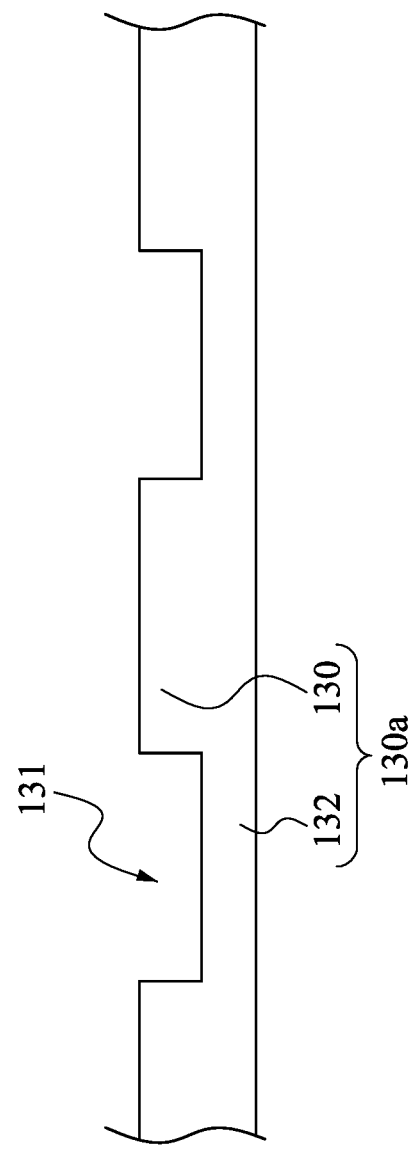
FIG. 5 is a cross-sectional view of the carrier shown in FIG. 4 after being ground and patterned.

FIG. 4 is a cross-sectional view of a carrier 130a according to one embodiment of the present invention. FIG. 5 is a cross-sectional view of the carrier 130a shown in FIG. 4 after being ground and patterned. As shown in FIG. 4 and FIG. 5, the carrier 130a may be a silicon wafer. The carrier 130a is ground. Thereafter, the carrier 130a is patterned, such that the carrier 130a has the recess 131. The recess 131 is defined by the bottom 132 and the dam element 130 of the carrier 130a, and the dam element 130 surrounds the bottom 132. "Patterning" may be referred to as a method that includes development, exposure, and etching processes in photolithography.

Figure 6:
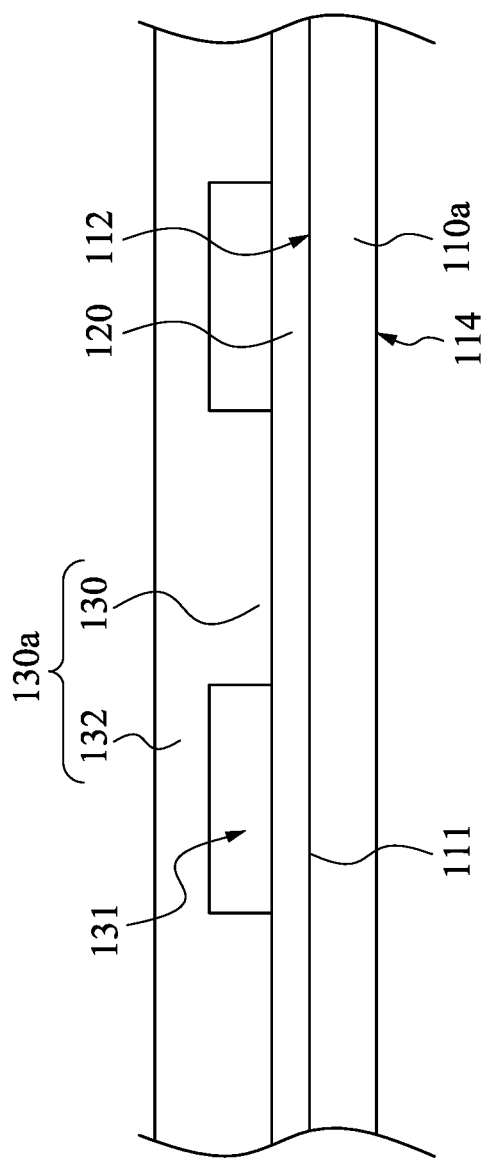
FIG. 6 is a cross-sectional view of a wafer after being adhered to the carrier shown in FIG. 5.

FIG. 6 is a cross-sectional view of a wafer 110a after being adhered to the carrier 130a shown in FIG. 5. The wafer 110a is referred to as a semiconductor structure that can be diced to form at least one chip 110 of FIG. 1. As shown in FIG. 5 and FIG. 6, the adhesive layer 120 may be used to adhere the carrier 110a to the first surface 112 of the wafer 110a, and the recess 131 is present between the adhesive layer 120 and the bottom 132 of the carrier 130a. The position of the recess 131 corresponds with the position of the sensing area 111. After the carrier 130a is adhered to the first surface 112 of the wafer 110a, the second surface 114 of the wafer 110a facing away from the first surface 112 may be ground, such that the thickness of the wafer 110a is reduced. The carrier 130a may provide a supporting force to the ground wafer 110a.

Figure 7:
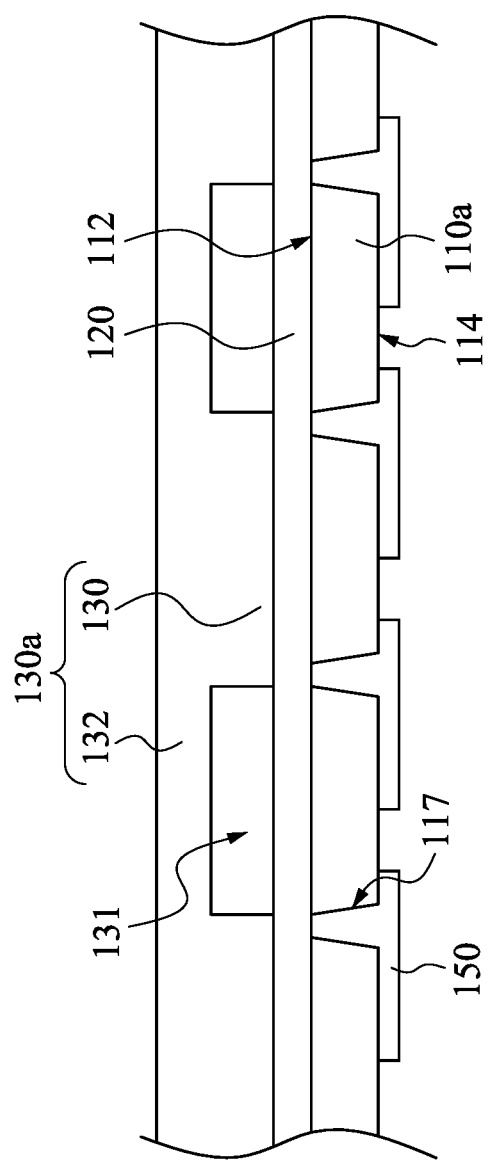
FIG. 7 is a cross-sectional view of a through hole and a redistribution layer after being respectively formed in and on the wafer shown in FIG. 6.
Figure 8:
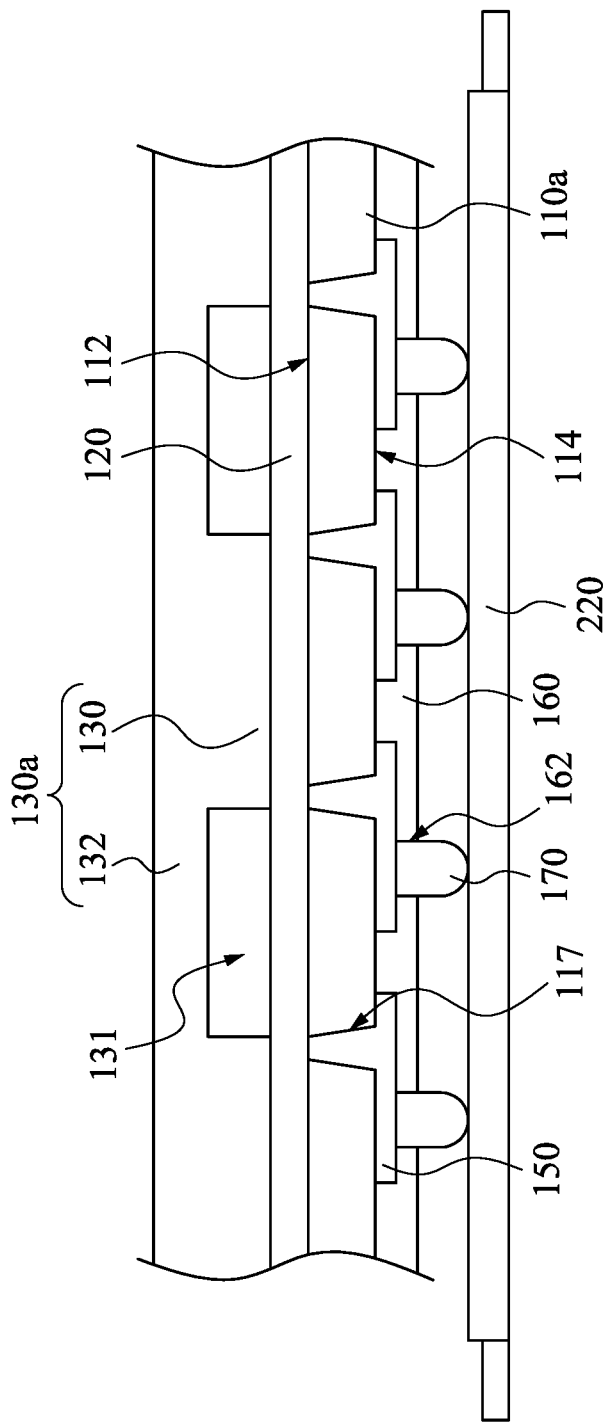
FIG. 8 is a cross-sectional view of a passivation layer and a conductive structure after being formed on a structure shown in FIG. 7, in which the structure is adhered to a protection tape.

FIG. 7 is a cross-sectional view of the through hole 117 and the redistribution layer 150 after being respectively formed in and on the wafer 110a shown in FIG. 6. FIG. 8 is a cross-sectional view of the passivation layer 160 and the conductive structure 170 after being formed on the structure shown in FIG. 7, in which the structure is adhered to a protection tape 220. As shown in FIG. 7 and FIG. 8, after the wafer 110a is ground, the through hole 117 may be formed in the second surface 114 of the wafer 110a. Next, the patterned redistribution layer 150 may be formed in the through hole 117 and on the second surface 114 of the wafer 110a. After the redistribution layer 150 is formed, the passivation layer 160 may be formed on the redistribution layer 150 and the second surface 114 of the wafer 110a. Thereafter, the passivation layer 160 may be patterned, such that the passivation layer 160 has the opening 162 to expose a portion of the redistribution layer 150. Subsequently, the conductive structure 170 may be formed on the redistribution layer 150 that is in the opening 162 of the passivation layer 160.

After the conductive structure 170 is formed, the conductive structure 170 may be adhered to the protection tape 220 for the protection of the conductive structure 170.

Figure 9:
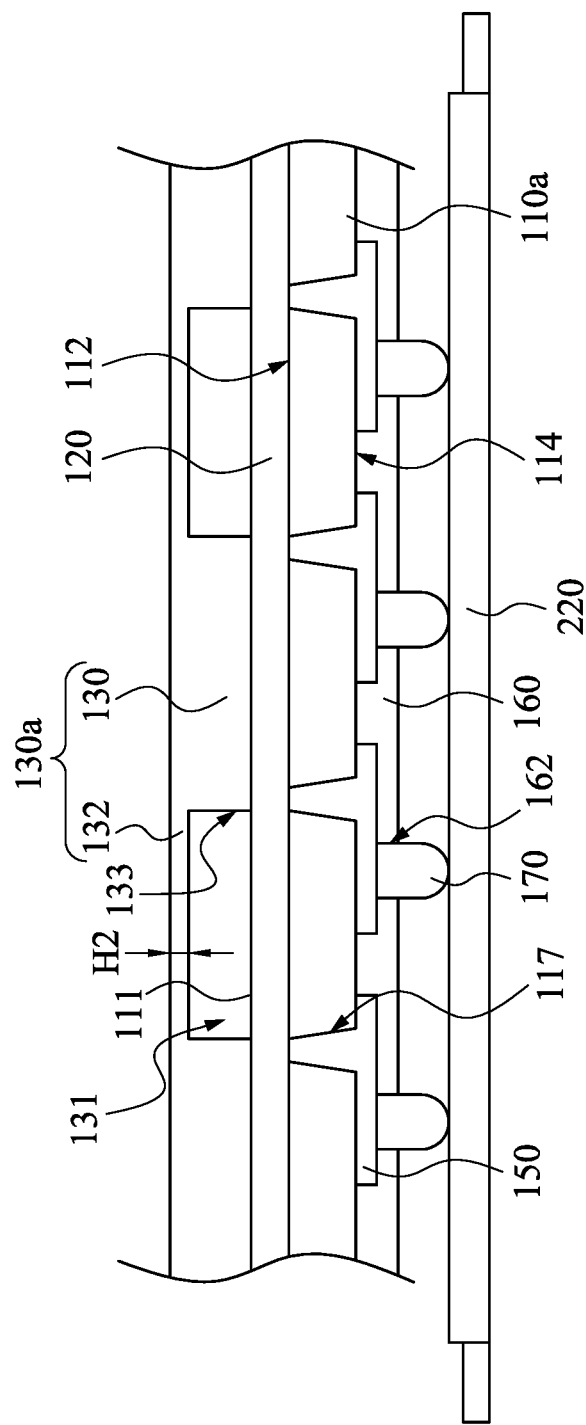
FIG. 9 is a cross-sectional view of a bottom of the carrier shown in FIG. 8 after being ground.

FIG. 9 is a cross-sectional view of the bottom 132 of the carrier 130a shown in FIG. 8 after being ground. As shown in FIG. 8 and FIG. 9, after the conductive structure 170 is adhered to the protection tape 220, the bottom 132 of the carrier 130a may be ground, such that the thickness H2 of the bottom 132 is in a range from 10 µm to 250 µm.

Figure 10:
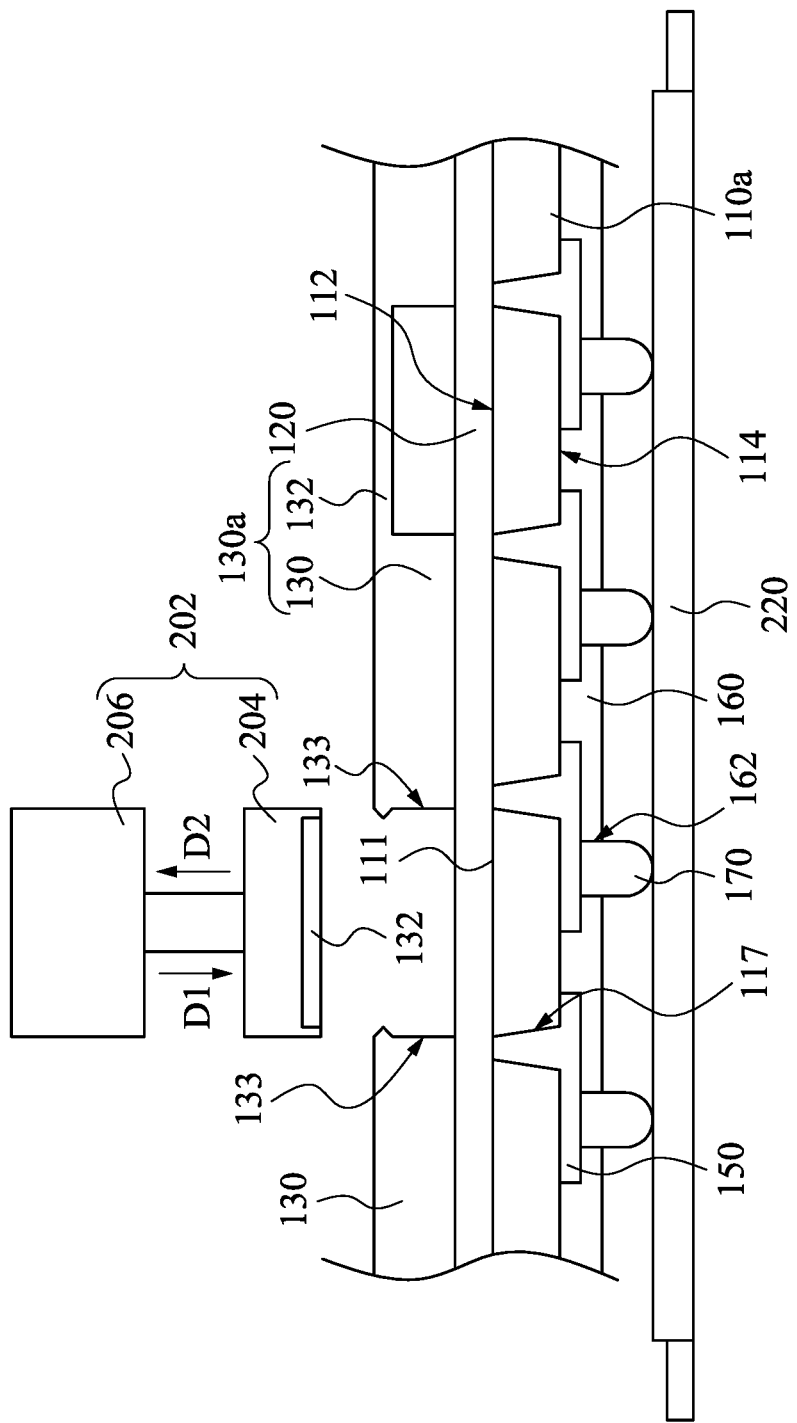
FIG. 10 is a schematic view of the bottom of the carrier shown in FIG. 9 after being impacted and attracted.

FIG. 10 is a schematic view of the bottom 132 of the carrier 130a shown in FIG. 9 after being impacted and attracted. As shown in FIG. 9 and FIG. 10, after the bottom 132 of the carrier 130a is ground, the structural strength of the bottom 132 above the recess 131 is reduced. Thereafter, the bottom 132 of the carrier 130a may be simultaneously impacted and attracted, such that the bottom 132 is separated from the dam element 130, and the wall surface 133 of the dam element 130 originally connected to the bottom 132 forms a rough surface. In other words, the rough surface is formed by breaking the connection of the bottom 132 and the dam element 130. In this embodiment, an impacting device 202 is used to impact and attract the bottom 132. The impacting device 202 has a nozzle head 204 and a pump 206, and the nozzle head 204 is connected to the pump 206. When the nozzle head 204 impacts the bottom 132 in a direction D1, the pump 206 simultaneously withdraws gas, such that the nozzle head 204 attracts the bottom 132 that is separated from the dam element 130. At this moment, the nozzle head 204 may move in a direction D2 to remove the bottom 132, as shown in FIG. 10. The present invention is not limited to the size and the shape of the nozzle head 204. The size and the shape of the nozzle head 204 may be varied depending on the area and the thickness of the bottom 132 that is present above the recess 131.

Figure 11:
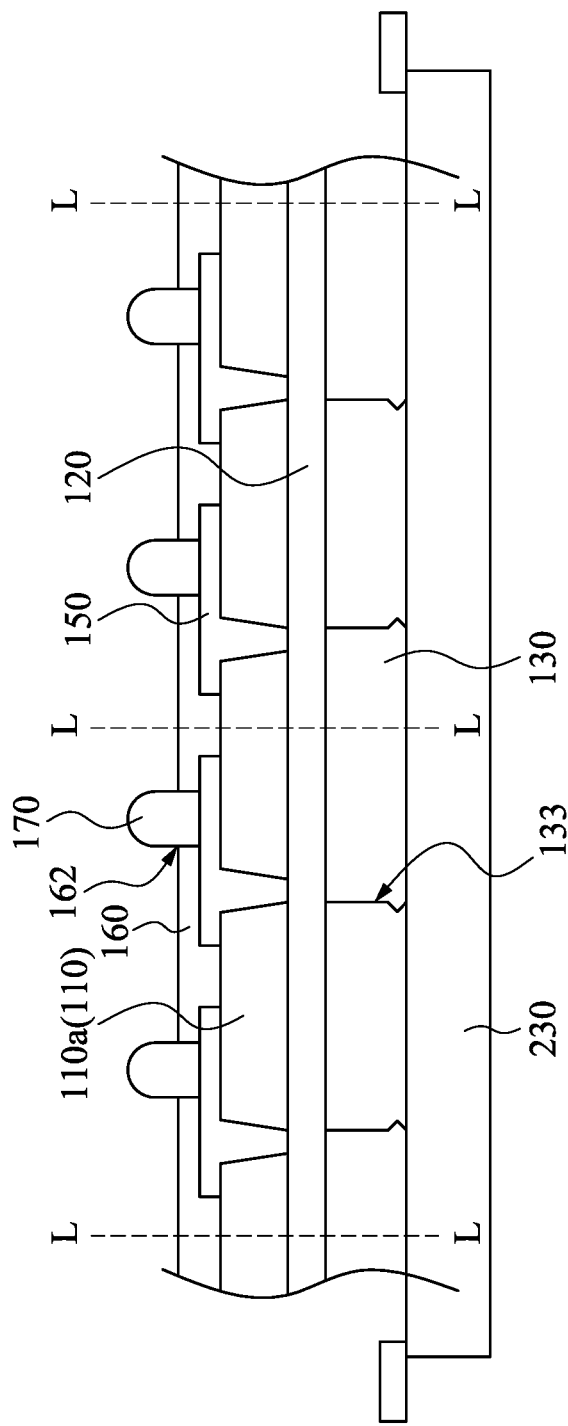
FIG. 11 is a cross-sectional view of a structure shown in FIG. 10 after the bottom of the carrier is removed and after adhering to a dicing tape, in which the protection tape is removed.

FIG. 11 is a cross-sectional view of the structure shown in FIG. 10 after the bottom 132 of the carrier 130a is removed and after adhering to a dicing tape 230, in which the protection tape 220 is removed. As shown in FIG. 10 and FIG. 11, before a cutting (dicing) process, the dam element 130 may be adhered to the dicing tape 230, and then the protection tape 220 adhered to the conductive structure 170 may be removed. In the state of FIG. 11, the wafer 110a and the dam element 130 may be cut along line L-L to form the chip package 100 shown in FIG. 2.

Specifically, when the wafer 110a and the dam element 130 are cut, the wafer 110a and the dam element 130 are cut on the dicing tape 230. After the wafer 110a and the dam element 130 are cut, the chip package 100 that is formed by cutting the wafer 110a and the dam element 130 and shown in FIG. 2 may be extracted from the dicing tape 230.

As shown in FIG. 2 and FIG. 9, since the dam element 130 of the chip package 100 is formed by patterning the carrier 130a, grinding the bottom 132 of the carrier 130a, and impacting the thinned bottom 132, the wall surface 133 of the dam element 130 originally connected to the bottom 132 forms a rough surface. As a result, the wall surface 133 of the dam element 130 surrounding the sensing area 111 is the rough surface. The thickness of the dam element 130 may be effectively controlled through the manufacturing method of the chip package 100 of the present invention, such that the dam element 130 is prevented from being overly thick to cause a petal flare defect in an image when the sensing area 111 detects the image. Moreover, in manufacturing the chip package 100, since the first surface 112 of the wafer 110a is adhered to the carrier 130a through the adhesive layer 120, even if the wafer 110a is thin, the thin wafer 110a is not limited by process limitations to difficultly move, and a warpage issue is not prone to occur. In addition, in the manufacturing method of the chip package 100, before the bottom 132 of the carrier 130a is impacted, the carrier 130a is disposed on the wafer 110a, such that the sensing area 111 of the chip 110 is not easily polluted during manufacturing processes, thereby improving product yield.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims.

What is claimed is:

1. A manufacturing method of a chip package, comprising:
   (a) grinding a carrier;
   (b) patterning the carrier, such that the carrier has a recess, wherein the recess is defined by a bottom and a dam element of the carrier, and the dam element surrounds the bottom;
   (c) using an adhesive layer to adhere the carrier to a first surface of a wafer, wherein the recess is present between the adhesive layer and the bottom of the carrier;
   (d) grinding the bottom of the carrier, such that a thickness of the bottom is in a range from 10 µm to 250 µm;
   (e) simultaneously impacting and attracting the bottom of the carrier, such that the bottom is separated from the dam element, and a wall surface of the dam element originally connected to the bottom forms a rough surface; and
   (f) cutting the wafer and the dam element to form the chip package.

2. The manufacturing method of claim 1, wherein step (e) comprises:
   using a nozzle head connected to a pump to impact the bottom of the carrier; and
   withdrawing gas by the pump, such that the nozzle head attracts the bottom that is separated from the dam element.

3. The manufacturing method of claim 1, further comprising:
   grinding a second surface of the wafer facing away from the first surface.

4. The manufacturing method of claim 3, further comprising:
   forming a through hole in the second surface of the wafer.

5. The manufacturing method of claim 4, further comprising:
   forming a patterned redistribution layer in the through hole and on the second surface of the wafer.

6. The manufacturing method of claim 5, further comprising:
   forming a passivation layer on the redistribution layer and the second surface of the wafer; and
   patterning the passivation layer, such that the passivation layer has an opening to expose a portion of the redistribution layer.

7. The manufacturing method of claim 6, further comprising:
   forming a conductive structure on the redistribution layer that is in the opening of the passivation layer.

8. The manufacturing method of claim 7, further comprising:
   adhering the conductive structure to a protection tape.

9. The manufacturing method of claim 8, further comprising:

adhering the dam element to a dicing tape; and
removing the protection tape.

10. The manufacturing method of claim 9, wherein step (f) comprises:
cutting the wafer and the dam element on the dicing tape; and
extracting the chip package that is formed by cutting the wafer and the dam element from the dicing tape.

* * * * *